(12) United States Patent
Kappes

(10) Patent No.: US 7,266,349 B2
(45) Date of Patent: Sep. 4, 2007

(54) MULTI-MODE CRYSTAL OSCILLATOR

(75) Inventor: Michael Kappes, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 434 days.

(21) Appl. No.: 10/912,858

(22) Filed: Aug. 6, 2004

(65) Prior Publication Data

US 2006/0030358 A1 Feb. 9, 2006

(51) Int. Cl.
*H04B 1/04* (2006.01)
*H04B 1/16* (2006.01)

(52) U.S. Cl. ............... 455/73; 455/574; 455/127.5; 455/343.1

(58) Field of Classification Search ........ 455/572–574, 455/127.4–127.5, 255–265, 343.1–343.4
See application file for complete search history.

(56) References Cited

U.S. PATENT DOCUMENTS 5,845,204 A * 12/1998 Chapman et al. ........ 455/343.1
2002/0024397 A1* 2/2002 Fujii et al. ............. 331/116 R
2003/0203722 A1* 10/2003 Karlquist et al. .......... 455/130
2004/0023680 A1* 2/2004 Hulvey .................. 455/522
2004/0042539 A1* 3/2004 Vishakhadatta et al. .... 375/216
2004/0063473 A1* 4/2004 Devries et al. ........... 455/572
2004/0082982 A1* 4/2004 Gord et al. ............... 607/60
2004/0158761 A1* 8/2004 Matsuoka et al. ......... 713/600

* cited by examiner

*Primary Examiner*—Simon Nguyen
(74) *Attorney, Agent, or Firm*—Garlick Harrison & Markison; James A. Harrison

(57) ABSTRACT

In one embodiment of the present invention, two crystal oscillator circuits are coupled in parallel to provide differing performance according to mode. Generally, a first circuit provides low phase noise and high accuracy while a second circuit provides greater phase noise within an acceptable tolerance while consuming significantly less power in a low power mode of operation. The second circuit includes an entirely separate amplifier for the low power operation that tolerates a relatively smaller input signal swing but that consumes even less power. The first circuit, which comprises selectable amplification elements, and the second circuit are coupled in parallel with selectable resistive elements and capacitive elements to provide varying amounts of amplification and filtering according to whether an operational mode is in a startup mode, a normal mode, or a low power mode of operation.

8 Claims, 6 Drawing Sheets

MULTI-MODE CRYSTAL OSCILLATOR

BACKGROUND

1. Technical Field

This invention relates generally to communication systems and, more particularly, to integrated time references within a device for use either as a clock reference or calibration master within portable electronics including radio frequency (RF) wireless devices operating in wireless communication systems.

2. Related Art

Communication systems are known to support wireless and wire lined communications between wireless and/or wired communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), wireless application protocol (WAP), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel of the other parties (e.g., one of the plurality of radio frequency (RF) carriers of the wireless communication system) and exchange information over that channel. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switched (PSTN) telephone network, via the Internet, and/or via some other wire lined or wireless network.

Each wireless communication device includes a built-in radio transceiver (i.e., receiver and transmitter) or is coupled to an associated radio transceiver (e.g., a station for in-home and/or in-building wireless communication networks, RF modem, etc.) to participate in wireless communications. As is known, the receiver receives RF signals, removes the RF carrier frequency from the RF signals via one or more intermediate frequency stages, and demodulates the signals in accordance with a particular wireless communication standard to recapture the transmitted data. The transmitter converts data into RF signals by modulating the data in accordance with the particular wireless communication standard and adds an RF carrier to the modulated data in one or more intermediate frequency stages to produce the RF signals.

As is also known, the receiver is coupled to the antenna and includes a low noise amplifier (LNA), zero or more intermediate frequency (IF) stages, a filtering stage, and a data recovery stage in many designs. The low noise amplifier receives an inbound RF signal via the antenna and amplifies it. The down converters mix the amplified RF signal with one or more local oscillations to convert the amplified RF signal into a baseband signal or an intermediate frequency signal. As used herein, the term "low IF" refers to both baseband and low intermediate frequency signals. A filtering stage filters the low IF signals to attenuate unwanted out of band signals to produce a filtered signal. The data recovery stage recovers raw data from the filtered signal in accordance with the particular wireless communication standard.

As the demand for enhanced performance (e.g., reduced interference and/or noise, improved quality of service, compliance with multiple standards, increased broadband applications, etc.), smaller sizes, lower power consumption, and reduced cost continue to be asserted, wireless communication device engineers are faced with a very difficult design challenge to develop a wireless communication device that satisfies requirements that sometimes appear to be mutually exclusive.

Integrated time references are used for many purposes, including synchronization of internal operations, synchronization with buses and external networks, among other applications. For example, for a device that communicates over an external synchronized bus, it is important that the device has an internal time reference that it can use to detect and respond to the signals on the bus. Generally, synchronized buses require that all operations happen at specified instants in time. Thus, a device must not only be able to read the synchronized signals being received on the bus, but must also be able to transmit at specified instants in a synchronized manner.

Crystal oscillators have long been used to provide very accurate time keeping functions as a result of their steady and predictable response to physical or electrical stimuli. Integrated circuits, however, by their very nature, cannot incorporate an internal crystal oscillator. Accurate internal time keeping is needed, for example, by analog-to-digital converter (ADC) circuits. ADCs are complex analog-to-digital converters that are often used to digitize analog wave forms, for example, voice wave forms, as a part of converting a voice signal to a digital signal that may be manipulated, stored or transmitted over a wireless medium. Other circuits that require accurate time keeping are the frequency generation circuits, such as phase-locked loops, so that ingoing and outgoing communication signals may readily be exchanged with other devices.

More specifically, the conversion of the voice signal from analog to digital will be most accurate and most reproducible if the sampling occurs at precise and constant measures of time. A transmitter must be able to accurately drive a signal on a synchronized bus. Thus, for these and many other reasons, a need exists not only for internal time sources that may be used as a reference signal, but also for accuracy. At the same time, however, there is the ever increasing need or desire to reduce power consumption in electronic circuits, especially for portable devices, to conserve battery life. Because of the desire to reduce power consumption, especially for portable devices, it is customary for a transceiver to operate in a sleep mode during periods of inactivity and in a normal mode while processing data. The sleep mode is provided to avoid wasting power when data is not being transmitted, received or processed. When a device is to end a sleep mode, it must periodically wake-up and attempt to establish a connection with nearby devices. The timing for waking up is required to be reasonably accurate, nonetheless. Additionally, when the device wakes up, it must be able to lock with a specified clock or with a received RF signal in order to accurately process data. Thus, most current designs include clock systems that consume sufficient power to provide accurate time keeping. Known designs that reduce power consumption during a sleep mode often fail to provide the desired accuracy. What is needed, therefore, is a system that maintains adequate clock timing while reducing power consumption.

SUMMARY OF THE INVENTION

In one embodiment of the present invention, two crystal oscillator circuits are coupled in parallel to provide differing performance according to mode. Generally, a first circuit provides low phase noise and high accuracy while a second circuit provides greater phase noise within an acceptable tolerance while consuming significantly less power in a low power mode of operation. The second circuit includes an separate amplifier for the low power operation that tolerates a relatively smaller input signal swing but that consumes even less power. The first circuit, which comprises selectable amplification elements, and the second circuit are coupled in parallel with selectable resistive elements and capacitive elements to provide varying amounts of amplification and filtering according to whether an operational mode is in startup mode, a normal mode, or a low power mode of operation.

A method of operation according to one embodiment of the present invention includes operating differing circuit configurations according to whether the device is in a startup mode, a normal mode, or a low power mode. In a startup mode, amplification is maximized and resistance and capacitance are minimized for the multi-mode oscillator. In a normal mode, amplification is optimized for performance, resistance is maximized, and the capacitance is tuned to correspond with a crystal frequency. In a low power mode, amplification is minimized so long as an oscillation is maintained, resistance is maximized, and capacitance is minimized or removed.

As one aspect of the embodiment of the invention, a plurality of amplifiers are provided wherein a first amplifier is operably selected for the startup and normal mode of operation and further wherein a second amplifier is operably selected for the low power mode of operation. More specifically, the second amplifier is a differential amplifier that receives a signal having a small signal swing and produces an output signal consuming less power than the first amplifier.

As will be described in greater detail below, a crystal oscillator is coupled to the first amplifier having an adjustable amplification block. Accordingly, the gain level of the first amplifier may be adjusted according to desired operation. Similarly, across the input and output nodes, a plurality of parallel coupled resistors are coupled to provide adjustable resistance levels in conjunction with a plurality of parallel coupled capacitors that are also selectable and are coupled across the input and output nodes of the first and second amplifiers. Accordingly, the adjustable resistance block with selectable resistors, in addition to a pair of the adjustable capacitive blocks with selectable capacitors, facilitate adjustment of the operation of the multi-mode crystal oscillator. In the specific embodiments of the invention, MOSFET devices are used as switches to operatively couple or decouple the resistors and capacitors of the adjustable resistance block and the adjustable capacitive blocks.

DETAILED DESCRIPTION

Figure 1:
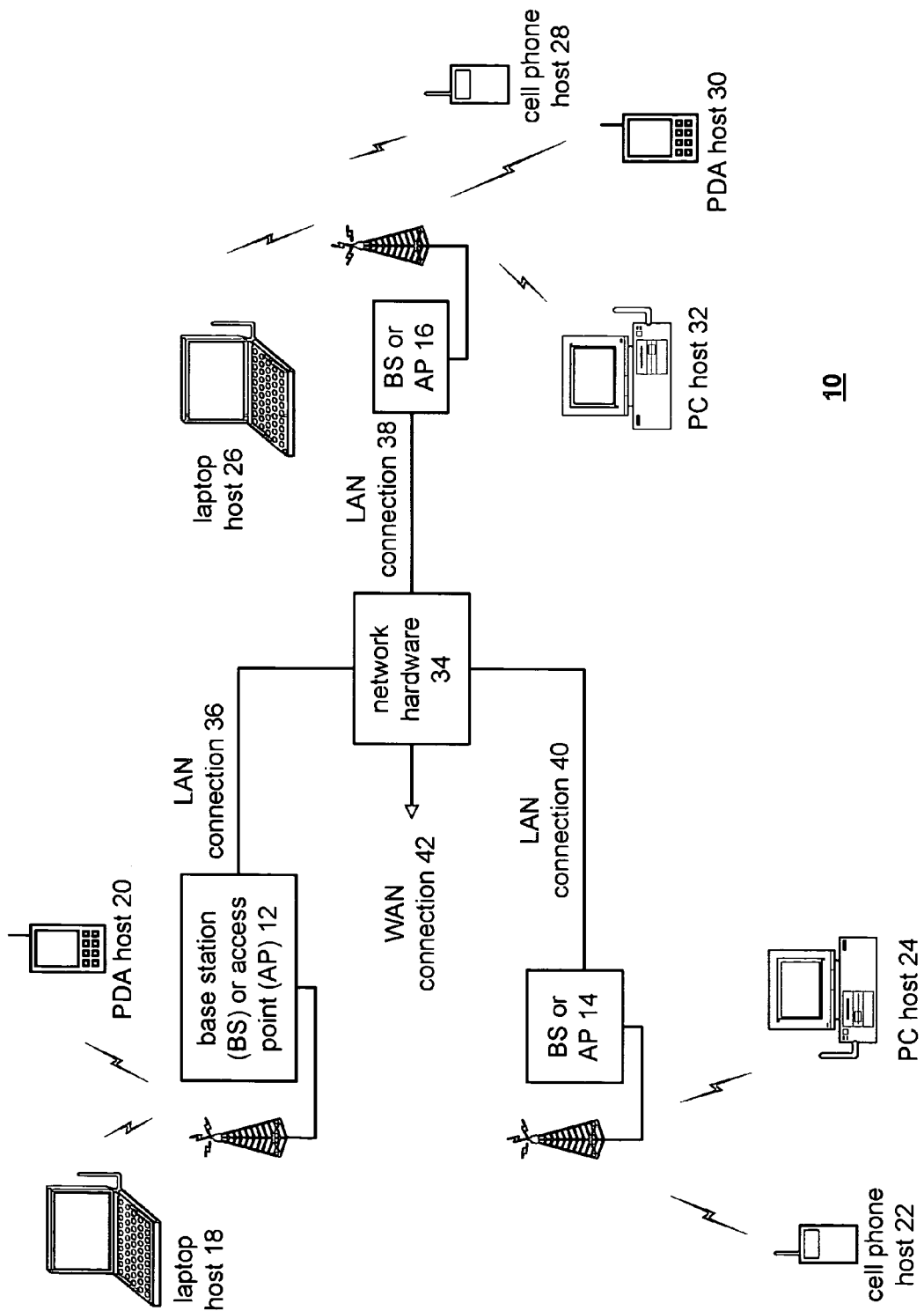
FIG. 1 is a schematic block diagram illustrating a communication system that includes a plurality of base stations and access points, a plurality of wireless communication devices and a network hardware component according to one embodiment of the present invention.

FIG. 1 is a schematic block diagram illustrating a communication system 10 that includes a plurality of base stations and access points 12-16, a plurality of wireless communication devices 18-32 and a network hardware component 34. Any one of the wireless communication devices may include an integrated temperature sensor formed according to an embodiment of the invention. The wireless plurality of communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10. Each of the plurality of base stations or access points 12-16 has an associated antenna or antenna array to communicate with the wireless communication devices in its area. Typically, the wireless communication devices register with a particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio may include a highly linear amplifier and/or programmable multi-stage amplifier as disclosed herein to enhance performance, reduce costs, reduce size, and/or enhance broadband applications. As such, anyone of the devices of FIG. 1, and especially the portable devices, may be formed to include any one of the embodiments of the invention.

Figure 2:
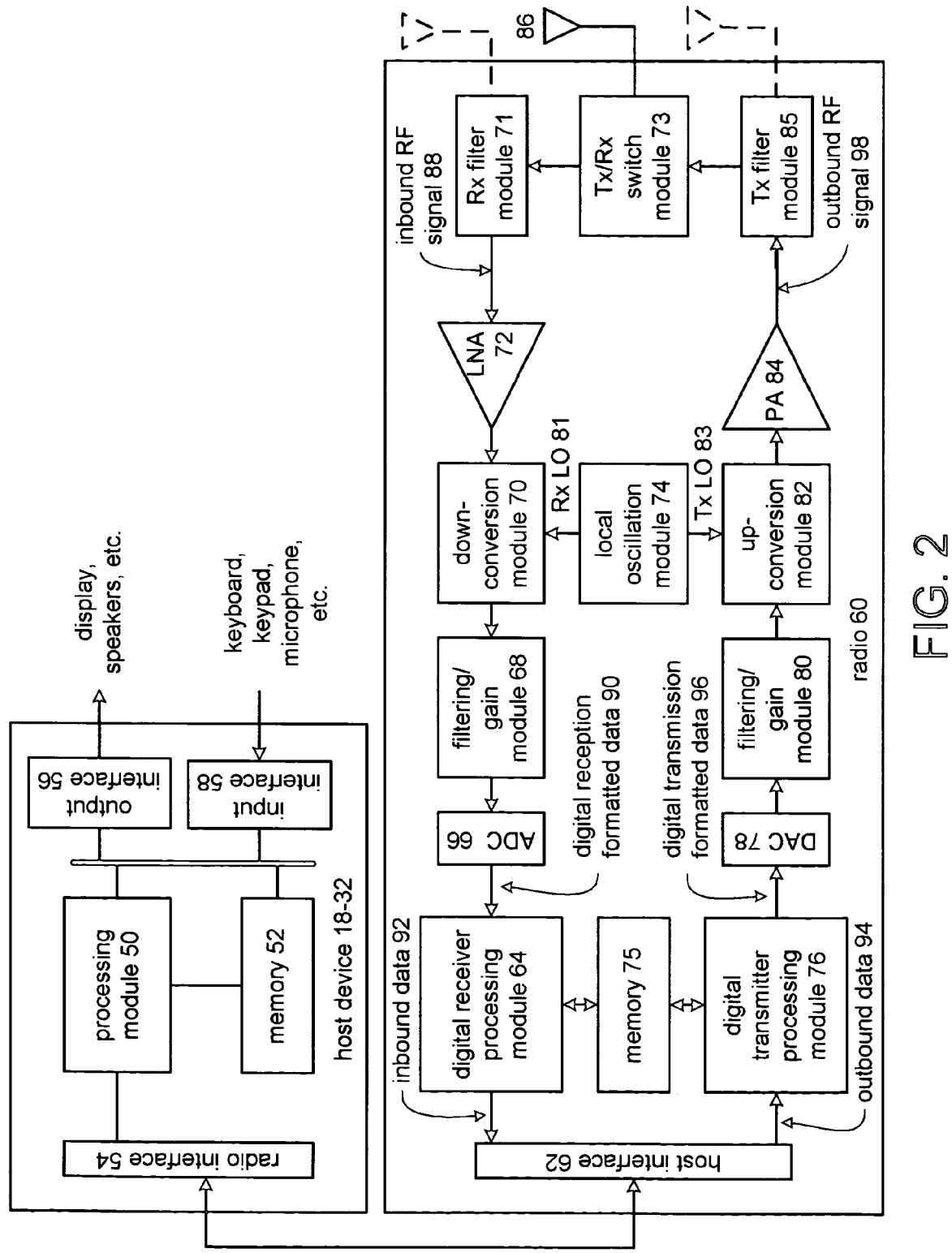
FIG. 2 is a schematic block diagram illustrating a wireless communication device that includes the host device and an associated radio.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device 18-32. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a receiver filter module 71, a low noise amplifier 72, a transceiver/receiver module 73, a local oscillation module 74, memory 75, a digital transmitter processing module 76, a digital-to-analog converter 78, a filtering/gain module 80, an up-conversion module 82, a power amplifier 84, a transceiver filter module 85, and an antenna 86. The antenna 86 may be a single antenna that is shared by the transmit and receive paths as regulated by the transceiver/receiver module 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transceiver functions, respectively. The digital receiver functions include, but are not limited to, digital intermediate frequency to baseband conversion, demodulation, constellation demapping, decoding, and/or descrambling. The digital transceiver functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array (FPGA), programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory (ROM), random access memory (RAM), volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated in FIGS. 3, et. seq. Within the blocks of FIG. 2, the embodiments of the invention may be used to provide required timing and clock signals to blocks such as the DAC and ADC blocks, the local oscillation module and the processor module among others.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF signal typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transceiver local oscillation 83 provided by local oscillation module 74. The power amplifier 84 amplifies the RF signal to produce outbound RF signal 98, which is filtered by the transceiver filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the transceiver/receiver module 73, where the receiver filter module 71 bandpass filters the inbound RF signal 88. The receiver filter module 71 provides the filtered RF signal to low noise amplifier 72, which amplifies inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation 81 provided by local oscillation module 74. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one skilled in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device 18-32 and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing modules 64 and 76.

Figure 3:
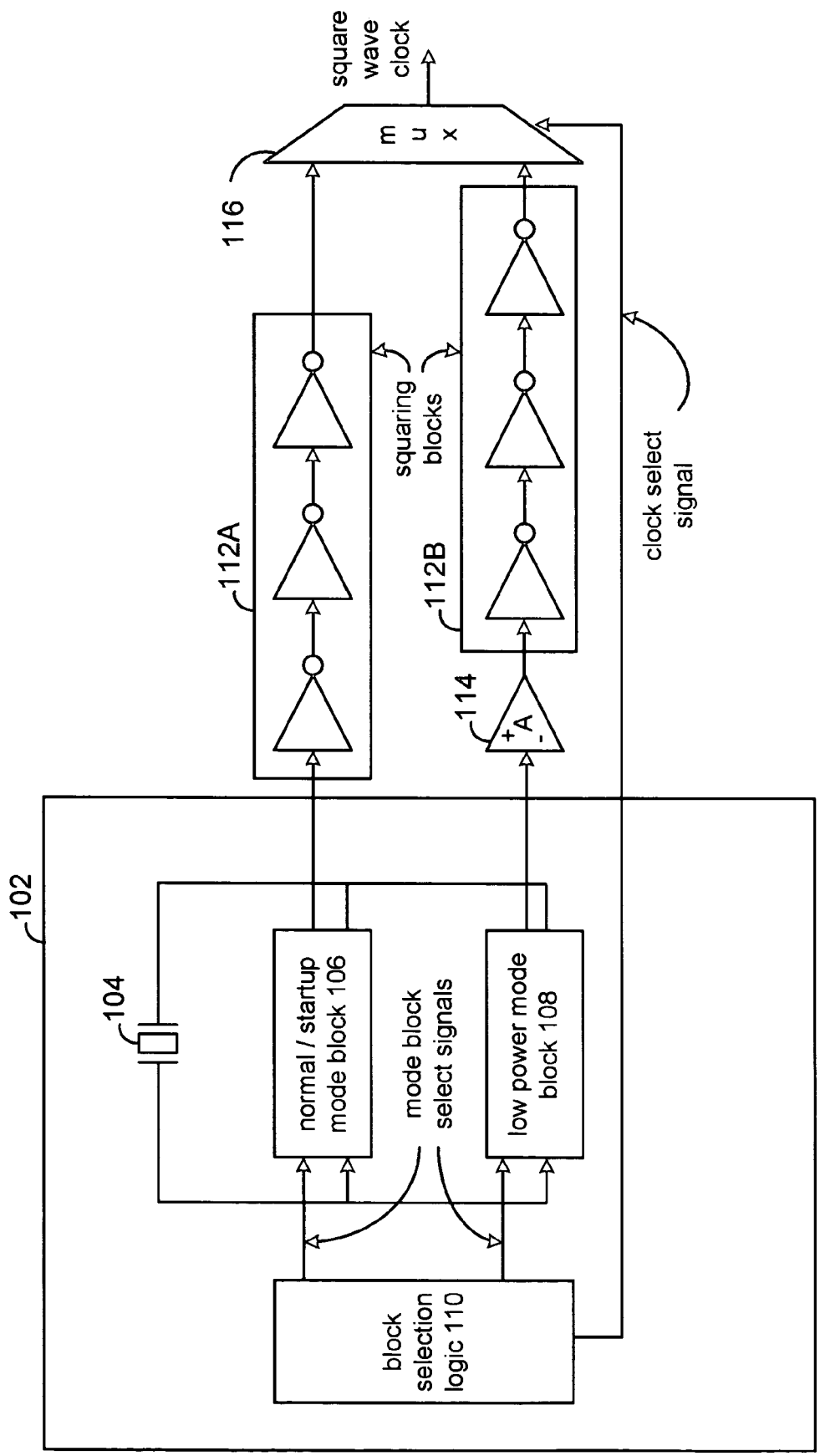
FIG. 3 is a functional block diagram of a dual mode crystal oscillator formed according to one embodiment of the present invention.

FIG. 3 is a functional block diagram of a dual mode crystal oscillator formed according to one embodiment of the present invention. As may be seen, an oscillator block 102 further includes a crystal 104 that is coupled to a parallel with a normal/startup mode block 106 and a low power mode block 108. Generally, only one of block 106 and block 108 is operably coupled to produce clock signals that are converted to a square wave clock signal by a squaring block. Block selection logic 110 produces mode block select signals to operatively couple one of blocks 106 and 108.

Mode block 106 generally produces an output signal that includes less phase error. One cost of this benefit, however, is that mode block 106 consumes more power than low power mode block 108. Because mode block 106 requires a signal having greater signal gain, the output signal is produced to a squaring block 112A having a plurality of inverters that operate to generate a square wave clock signal without requiring additional amplification. The output of low power mode block 108, however, produces an output signal that requires additional amplification. Accordingly, the output of low power mode block 108 is produced initially to an amplifier 114 prior to being produced to a squaring block 112B containing a plurality of inverters to produce a square wave clock signal. The outputs of each of the squaring blocks 112A and 112B are then produced to a multiplexer 116 which selects an output signal to produce the square wave caught based upon a clock select signal generated by block selection logic 110.

In operation, oscillator block 102, and more specifically, block selection logic 110, selects mode block 106 during startup and normal modes of operation and further selects low power mode block 108 only during a low power mode of operation, such as a sleep mode.

Figure 4:
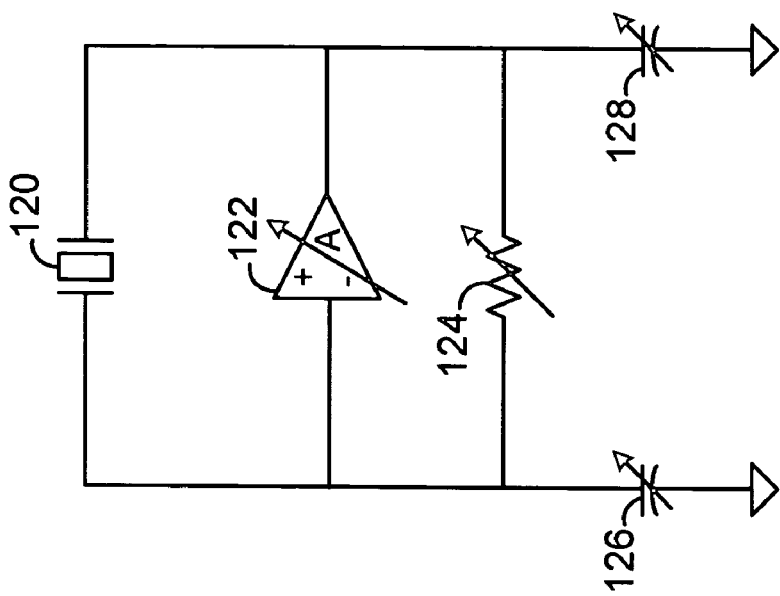
FIG. 4 is a functional block diagram of a multi-mode crystal oscillator formed according to one embodiment of the present invention.

FIG. 4 is a functional block diagram of a multi-mode crystal oscillator formed according to one embodiment of the present invention. As may be seen, a crystal 120 is coupled in parallel with a variable amplifier 122 and with a variable resistor 124. Between an input side of the variable amplifier 122 and circuit common is a variable capacitor 126. Similarly, between an output side of the variable amplifier 122 and circuit common is a variable capacitor 128. Generally, the values of resistor 124, capacitor 126, and capacitor 128, as well as the gain level settings of variable amplifier 122, are set according to whether the multi-mode crystal oscillator is in a startup mode, a normal mode, or a low power mode of operation. More specifically, in a startup mode, the variable amplifier 122 is set to maximize the gain level setting while the resistive and capacitive values are minimized. In a normal mode of operation, the gain level settings of variable amplifier 122 are optimized for performance considering factors such as power consumption, flicker noise, and output gain, the resistive value is maximized, and the capacitive value is tuned for the crystal frequency. One of average skill in the art may readily determine acceptable values therefor. Finally, in a low power mode of operation, the capacitors are turned off, or, alternatively, minimized, while the resistive values are maximized and the gain level settings of the variable amplifier 122 are minimized to the level for which oscillation may be maintained.

To achieve some of these settings, one approach that may be employed is to selectively vary the gain level settings, the resistive values, and the capacitive values in a test mode with a test chip wherein the determined optimal (or acceptable) settings are selected for production chips. Because the integrated circuits are formed with selectable components that may be selected by firmware or, more generally, in production, the chips may be programmed in production to have the determined values for gain, resistance and capacitance in response to the various modes of operation as determine through test of the test chips.

Figure 5:
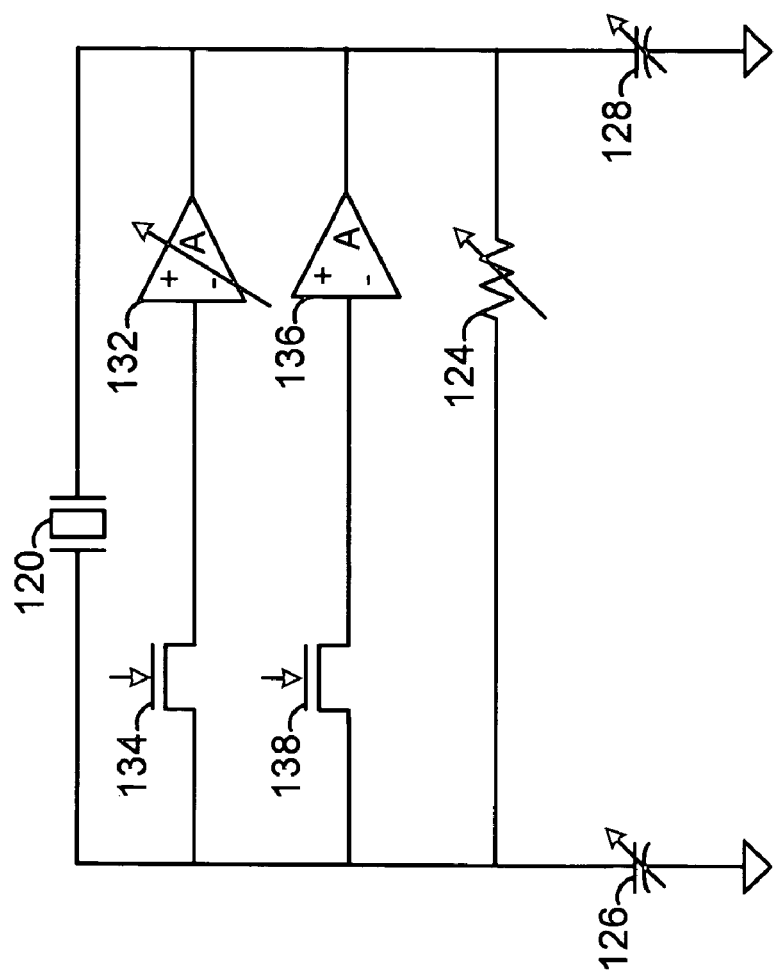
FIG. 5 is a functional block diagram of a multi-mode crystal oscillator according to one embodiment of the present invention.

FIG. 5 is a functional block diagram of a multi-mode crystal oscillator according to one embodiment of the present invention. In relation to the multi-mode crystal oscillator of FIG. 4, crystal 120 and resistor 124 are coupled in parallel with a pair of selectable amplifiers. More specifically, a variable gain of an amplifier 132 is coupled in series with a switch 134. In the described embodiment of the invention, switch 134 comprises a MOSFET switch that closes a circuit connection based upon a bias signal across a gate of the MOSFET switch 134. Similarly, an amplifier 136 is coupled in series with a MOSFET switch 138. Switches 134 and 138 are coupled to receive logically opposite bias signals so that only one of amplifiers 132 and 136 are operatively coupled across crystal 120 to produce an oscillation in conjunction with resistor 124, capacitor 126 and capacitor 128 in the described embodiment.

In operation, switch 138 remains open and switch 134 remains closed thereby operatively coupling amplifier 132 and operatively decoupling amplifier 136 during the startup and normal mode of operation. Alternatively, switch 138 is closed and switch 134 is open to operatively decouple amplifier 132 and operatively couple amplifier 136 during a low power mode of operation. Generally, amplifier 132 consumes more power than amplifier 136 but produces an output signal that requires no additional amplification as a part of forming a square wave clock signal. Amplifier 132 is formed to receive an input signal having a substantially greater peak to peak value relative to an input signal for amplifier 136. As such, amplifier 132 produces a cleaner signal at a cost of consuming greater power. Because amplifier 136 is formed to receive an input signal having a substantially lower peak to peak value, the output of amplifier 136 requires additional amplification thereby introducing some phase noise or other types of noise. While such operation is more noisy, including, for example, greater phase noise than is produced by amplifier 132, the result of using amplifier 136 in conjunction with another amplifier produces an oscillation over an extended period of time that is substantially more accurate than non-crystal based oscillators and is not subject to frequency drift. Over time, any phase error averages out thereby producing a substantially accurate clock or timing signal.

Figure 6:
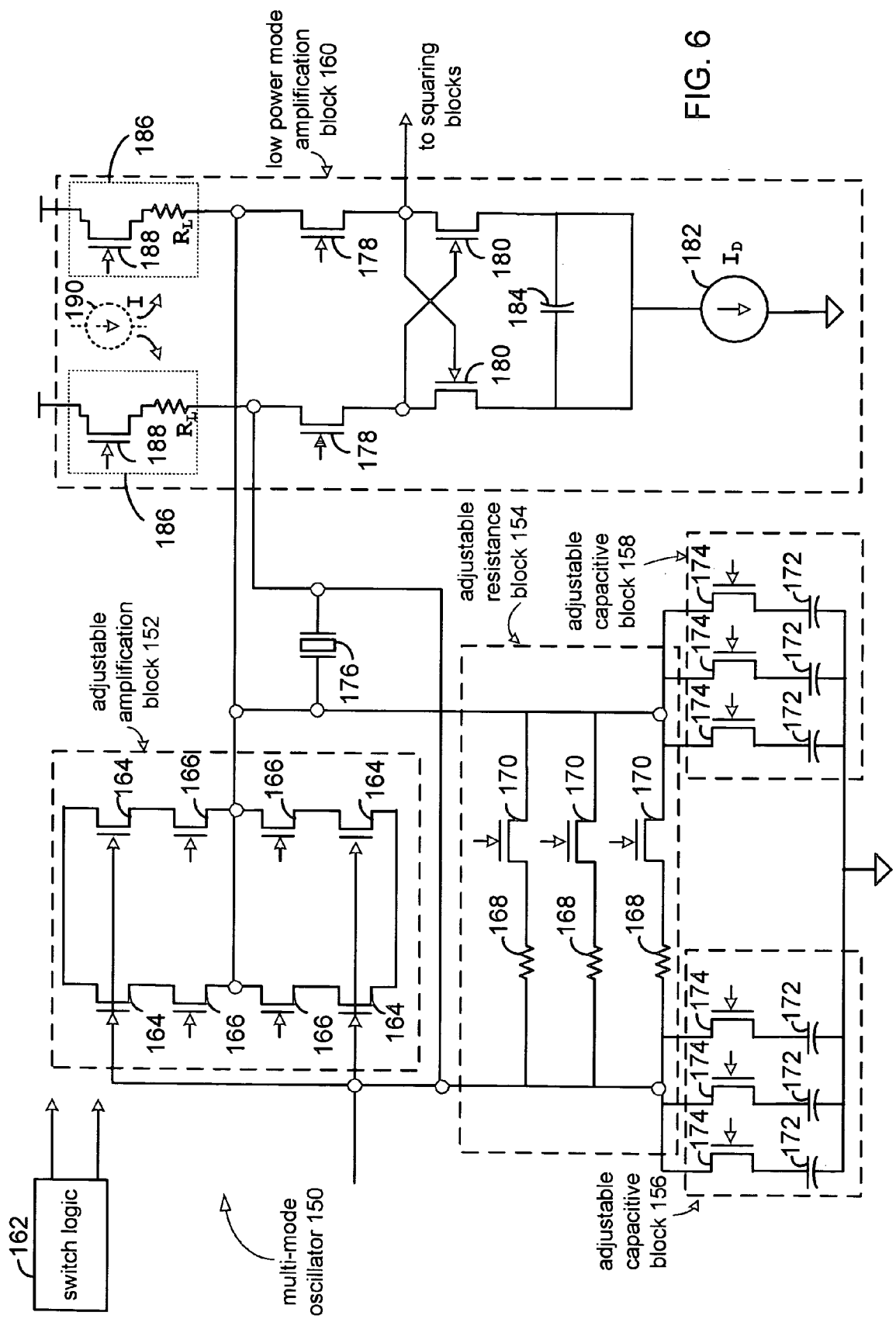
FIG. 6 is a functional block diagram of a multi-mode crystal oscillator according to one embodiment of the present invention.

FIG. 6 is a functional block diagram of a multi-mode crystal oscillator according to one embodiment of the present invention. A multi-mode oscillator 150 includes an adjustable amplification block 152, an adjustable resistance block 154, adjustable capacitive blocks 156 and 158, and a low power mode amplification block 160. Additionally, a switch logic block 162 generates bias signals to open and close MOSFET switches within blocks 152-160 according to operational mode. Adjustable amplification block 152 comprises a plurality of columns of MOSFET transistors that are each coupled in a series with a MOSFET switch.

In one embodiment of the invention, a first column of transistors is characterized by MOSFET transistors having a 12-to-1 length-to-width ratio. A second column of transistors is characterized by MOSFET transistors having a 12-to-4 length-to-width ratio. Generally, increasing a transistor area by a factor of four reduces flicker noise by a factor of two. Increasing a transistor's length by a factor of four typically reduces the current by a factor of two. Overall, changing transistor dimensions as described reduces gain approximately by a factor of four. Thus, increasing transistor dimensions lowers flicker noise and power consumed at a cost of decreased gain.

As described above, it is typically optimal to maximize gain in a startup mode of operation. In a normal mode of operation, however, gain is optimized for performance. Thus, if the plurality of columns of transistors of the variable gain amplifier are formed, as they are in the described embodiment of the invention, to have different dimensions and a corresponding gain level and flicker noise, performance of the multi-mode oscillator may be optimized. The above described ratios for the transistors are exemplary and may readily be modified as necessary for a particular application. Such modifications are considered to be within the scope of the invention.

Generally, switch logic block 162 generates control commands to operatively couple any one of transistors 164 by operatively biasing its corresponding switch 166. Within adjustable resistance block 154, any one of a plurality of resistors 168 may be operatively coupled into connection by its corresponding series coupled MOSFET switch 170 with an appropriate bias signal. Similarly, capacitors 172 of adjustable capacitive blocks 158 and 156 may be operatively coupled into connection by providing a bias signal to MOSFET transistors 174.

As may also be seen, low power mode amplification block 160 is coupled in parallel with adjustable amplification block 152 which is further coupled in parallel with a crystal 176. Low power mode amplification block 160 further includes a pair of MOSFET switches 178 that may be bias to operatively couple a differential amplifier formed by a pair of MOSFETs 180. As may be seen, the source terminals of MOSFETs 180 are commonly coupled to a current sink 182 that provides a bias current therefor. As may also be seen, a capacitor 184 is coupled across the source terminals of MOSFETs 180 for filtration purposes among others. Additionally, a pair of load blocks 186 are coupled between supply and amplification blocks 160 and 152. In the embodiment shown, each load block includes a MOSFET switch 188 and a load resistor $R_L$. In an alternate embodiment, each of the load blocks 186 is replaced by a current source 190. In a high power mode of operation, switches 188 are biased off to decouple the load resistors $R_L$. In the alternate embodiment utilizing current sources 190 in place of the load resistors $R_L$, the current sources are turned off. Supply is still coupled at other locations within the circuit. Thus, the crystal 176 and supply remain operatively coupled even with the loads removed in the high power modes of operation. Finally, it should be noted that crystal 176 as shown is coupled across low power amplification block 160 as well as adjustable amplification block 152.

In operation, when a device that includes multi-mode oscillator 150 is in a startup mode of operation, gain level settings are maximized. Accordingly, switch logic block 162 generates bias signals to each of the MOSFET switches 166 to close the connection and to operatively couple MOSFET transistors 164 to produce maximum gain level settings. Similarly, according to the teachings of the present embodiments of the invention, it is desirable to minimize the resistive value of the adjustable resistance block 154. Accordingly, switch logic block 162 generates bias signals to operatively bias MOSFET switches 170 to operatively couple each of the resistors 168 to minimize resistance and capacitor rise time. As is known by one of average skill in the art, coupling resistors in parallel reduces overall resistance and therefore minimizes the resistive value of adjustable resistance block 154. Similarly, because it is desirable to minimize capacitance according to the described embodiment of the present invention, and because coupling capacitors in parallel serves to increase overall capacitance, one of or even no capacitors 172 are operatively coupled by corresponding MOSFET transistors 174 in the startup mode. Thus, switch logic block 162 either generates no bias signals to transistors 174 or, alternatively, only operatively bias one transistor 174 for each of the adjustable capacitive blocks 156 and 158. To keep FIG. 6 from becoming overly crowded with information, the bias signals as generated by switch logic block 162 and as received by each of the MOSFET switches at the gate terminal, are not shown, though such coupling and operation should be understood to exist. After an initial period in which all three resistors 168 are operatively coupled, one or more resistors are decoupled to increase resistance and gain of the amplifier. Improving the gain further improves the quality of the resonator. One of average skill in the art may readily determine the specific resistance values and associated timing therefor in order to satisfy specific circuit design and performance requirements.

When the multi-mode oscillator 150 is in a normal mode of operation, gain level settings are optimized for performance. In this embodiment, not all MOSFET transistors 164 of adjustable amplification block 152 are operatively coupled to provide amplification. Generally, it is desirable to increase transistor area to reduce flicker noise and to reduce required current levels while providing adequate gain. For example, in one embodiment of the present invention, the first column of transistors having a 12-to-1 length-to-width ratio may be operatively decoupled, while the second column of transistors having a 12-to-4 length-to-width ratio may be operatively coupled. For exemplary purposes, such a coupling may reduce power used by a factor of two, may reduce flicker noise by a factor of two, or may also reduce the output gain by a factor of four. If such performance in terms of gain is acceptable, then the battery life of the portable device is increased while oscillator performance is improved.

When the mode of operation transitions to a low power mode of operation, for example, during a sleep mode, the first and second rows of transistors of adjustable amplification block 152 are turned off. Additionally, the resistance value of adjustable resistance block 154 is maximized by decoupled two of the resistors 168 and the capacitive value adjustable capacitive block is minimized by coupling either no or a minimal number of capacitors as described before.

Figure 7:
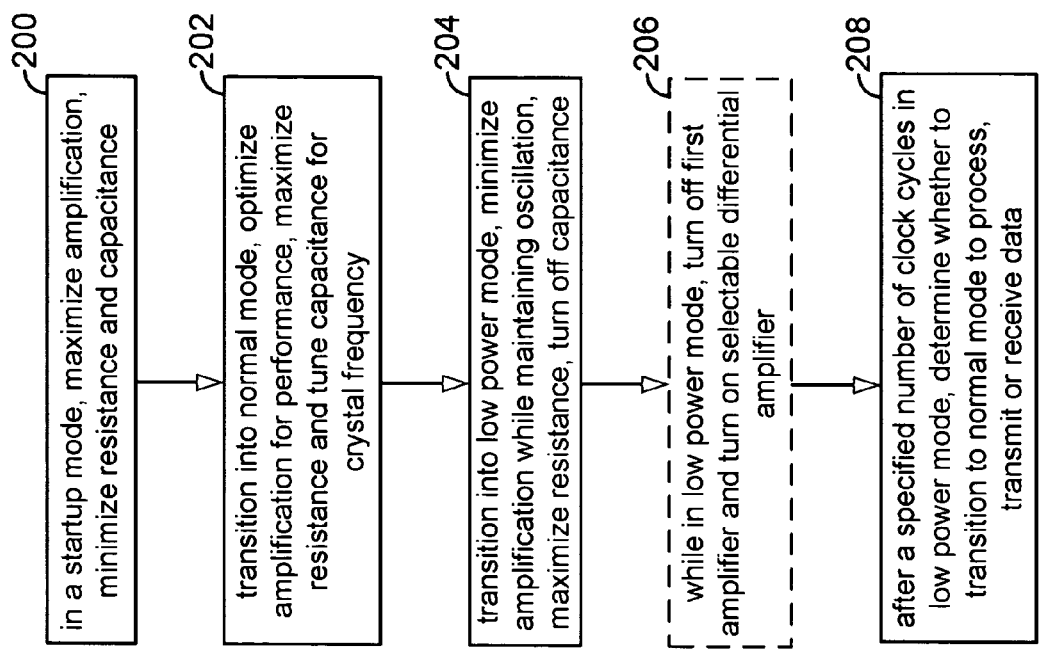
FIG. 7 is a flowchart that illustrates operation according to one embodiment of the present invention.

FIG. 7 is a flowchart that illustrates operation according to one embodiment of the present invention. In a startup mode of operation, the inventive method includes maximizing amplification, and minimizing resistance and capacitance (step 200). As a device transitions into a normal mode of operation, the inventive method includes optimizing amplification for performance, maximizing resistance and tuning capacitance for the crystal frequency (step 202). When the device transitions into a low power mode, for example into a sleep mode, the method includes minimizing amplification while maintaining oscillation, maximizing resistance, and turning off capacitance by decoupling capacitors (step 204). In one embodiment of the present invention, the method includes, while in a low power mode, turning off a first amplifier and turning on a selectable differential amplifier (step 206). Finally, while operating in a low power mode of operation, the invention includes, after a specified number of clock cycles, determining whether to transition to a normal mode to process, transmit, or receive data (step 208). Generally, a device might transition from a low power mode to a normal mode after about 30 seconds to determine whether there is data that needs to be processed, transmitted, or received. Once such data processing is complete, the device may transition back into a low power mode of operation. Thus, one benefit of the embodiment of the invention is realized. Accurate low power time keeping for a period in the range of 30 seconds or greater may be achieved.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention. For example, references to operation of a digital signal processor also may apply to baseband processors and vice-versa. Similarly, any combination of the teachings herein may be modified to achieve similar but different results.

What is claimed is:

1. A multi-mode oscillator comprising:
adjustable resistance block;
adjustable capacitance block;
first amplifier for operatively coupling to the adjustable resistance and capacitance blocks during startup and normal modes of operation; and
second amplifier for operatively coupling to the adjustable resistance and capacitance blocks during lower power modes of operation wherein the multi-mode oscillator operably adjusts at least one of gain level settings, resistive settings and capacitive settings based upon whether the transceiver is in a startup mode, a normal mode or a low power mode of operation.

2. The multi-mode oscillator of claim 1 wherein the multi-mode oscillator further includes a plurality of amplifiers for mutually exclusive operation that are oppositely biased on and off relative to each other.

3. The multi-mode oscillator of claim 2 further including switch logic to operatively couple transistors of the first and second amplifiers to set gain levels and to select operation thereof, to operatively couple resistors of the adjustable resistance block to adjust resistance, and to operatively couple capacitors of the adjustable capacitance block to adjust capacitance.

4. The multi-mode oscillator of claim 3 wherein, in a startup mode of operation, gain levels are maximized, and resistance and capacitance are minimized.

5. The multi-mode oscillator of claim 3 wherein, in a normal mode of operation, gain levels are optimized, resistance is maximized, and capacitance is tuned to match a crystal frequency.

6. The multi-mode oscillator of claim 3 wherein, in a low power mode of operation, gain levels are minimized, and resistance is maximized and capacitance is minimized.

7. The multi-mode oscillator of claim 6 wherein capacitance provided by capacitive devices is removed in a low power mode of operation.

8. The multi-mode oscillator of claim 7 wherein, in a low power mode of operation, a first amplifier having adjustable gain level settings is operatively decoupled and a second amplifier having low power consumption is operatively coupled to oscillator circuitry of the multi-mode oscillator.

* * * * *